United States Patent
Lee et al.

(10) Patent No.: US 10,079,589 B2
(45) Date of Patent: Sep. 18, 2018

(54) THIN FILM BULK ACOUSTIC RESONATOR AND METHOD FOR MANUFACTURING SAME

(75) Inventors: Moon Chul Lee, Yongin-si (KR); In Sang Song, Yongin-si (KR); Duck Hwan Kim, Yongin-si (KR); Chul Soo Kim, Yongin-si (KR); Sang Uk Son, Yongin-si (KR); Jea Shik Shin, Yongin-si (KR); Ho Soo Park, Yongin-si (KR); Jing Cui, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 635 days.

(21) Appl. No.: 14/353,561

(22) PCT Filed: Jun. 7, 2012

(86) PCT No.: PCT/KR2012/004466
§ 371 (c)(1),
(2), (4) Date: Jul. 21, 2014

(87) PCT Pub. No.: WO2013/062203
PCT Pub. Date: May 2, 2013

(65) Prior Publication Data
US 2014/0339959 A1    Nov. 20, 2014

(30) Foreign Application Priority Data

Oct. 25, 2011 (KR) .................. 10-2011-0109254

(51) Int. Cl.
*H03H 9/17* (2006.01)
*H03H 3/02* (2006.01)
(Continued)

(52) U.S. Cl.
CPC .......... *H03H 9/173* (2013.01); *H01L 41/297* (2013.01); *H01L 41/312* (2013.01);
(Continued)

(58) Field of Classification Search
CPC ........ H03H 9/173; H03H 3/02; H01L 41/297; H01L 41/312
(Continued)

(56) References Cited

U.S. PATENT DOCUMENTS 7,057,477 B2 * 6/2006 Wang .................. H03H 3/02
                                                              310/324
2004/0183399 A1   9/2004 Nakatani et al.
(Continued)

FOREIGN PATENT DOCUMENTS

JP    10-270979 A    10/1998
JP    2002-198758 A   7/2002
(Continued)

OTHER PUBLICATIONS

Silicon Dioxide Properties, Dec. 30, 2016.*
(Continued)

*Primary Examiner* — Bryan Gordon
(74) *Attorney, Agent, or Firm* — NSIP Law (57) ABSTRACT

A thin film bulk acoustic resonator and a method of manufacturing the same is disclosed. The thin film bulk acoustic resonator includes an acoustic resonator including a first electrode, a second electrode, and a piezoelectric layer disposed between the first electrode and the second electrode; an air gap disposed below the acoustic resonator and above a substrate to reflect the acoustic wave; and an anchor disposed on each of both surfaces of the air gap and having the same thickness as the air gap.

22 Claims, 5 Drawing Sheets

(51) Int. Cl.
  *H01L 41/297* (2013.01)
  *H01L 41/312* (2013.01)
  *H01L 41/332* (2013.01)

(52) U.S. Cl.
  CPC ............ *H01L 41/332* (2013.01); *H03H 3/02* (2013.01); *H03H 9/175* (2013.01); *H03H 2003/021* (2013.01)

(58) Field of Classification Search
  USPC ........................................ 310/347, 348, 349
  See application file for complete search history.

(56) References Cited

U.S. PATENT DOCUMENTS

| | | | |
|---|---|---|---|
| 2005/0077803 A1* | 4/2005 | Ha ........................... | H03H 3/02 310/324 |
| 2006/0017352 A1 | 1/2006 | Tanielian | |
| 2008/0042780 A1* | 2/2008 | Lee ........................... | H03H 3/02 333/187 |
| 2008/0061907 A1* | 3/2008 | Lee ........................... | H03H 3/02 333/188 |
| 2010/0327697 A1* | 12/2010 | Choy ................ | H03H 9/02118 310/335 |
| 2011/0006860 A1* | 1/2011 | Hara ........................ | H03H 3/02 333/187 |
| 2013/0063227 A1* | 3/2013 | Burak .................... | H03H 9/131 333/187 |
| 2013/0106534 A1* | 5/2013 | Burak .................... | H03H 9/173 333/187 |

FOREIGN PATENT DOCUMENTS

| | | |
|---|---|---|
| JP | 2010-141570 A | 6/2010 |
| KR | 10-2004-0089914 A | 10/2004 |
| KR | 10-2004-0102390 A | 12/2004 |
| KR | 10-2005-0006996 A | 1/2005 |
| KR | 10-2005-0058300 A | 6/2005 |

OTHER PUBLICATIONS

International Search Report dated Nov. 20, 2012 in corresponding International Patent Application No. PCT/KR2012/004466 (5 pages in Korean with English Translation).
Korean Office Action dated Oct. 25, 2017 corresponding Korean Patent Application No. 2011-0109254 (5 pages Korean, 4 pages English).
Korean Office Action dated May 9, 2018 in Korean Patent Application No. 10-2011-0109254 (2 pages in English, 4 pages in Korean).

\* cited by examiner

THIN FILM BULK ACOUSTIC RESONATOR AND METHOD FOR MANUFACTURING SAME

CROSS-REFERENCE TO RELATED APPLICATION(S)

This application claims the benefit under 35 U.S.C. § 119(a) of Korean Patent Application No. 10-2011-0109254 filed on Oct. 25, 2011, in the Korean Intellectual Property Office, and under 35 U.S.C. § 119(e) of the PCT Application No. PCT/KR2012004466 filed on Jun. 7, 2012, the entire disclosure of these applications are incorporated herein by reference for all purposes.

BACKGROUND

Field

The following description relates to a film bulk acoustic resonator (FBAR).

Description of Related Art

With the rapid development of communications technology, there is a demand for development of technology related to high-frequency components corresponding to the communications technology. Wireless communication equipment is being miniaturized and thus, technology that miniaturizes high-frequency components may be required.

Among the high-frequency components, a filter may be miniaturized using semiconductor thin film wafer manufacturing technology. A film bulk acoustic resonator (FBAR) may operate through electrodes disposed above and below a piezoelectric layer. When a high-frequency electrical potential is applied to the electrodes, the piezoelectric layer may oscillate and the FBAR may operate as a filter.

The FBAR may be used for a wireless signal transfer system. For example, the FBAR may be used as a component for a wireless communication device, wireless power transmission, a filter of a wireless sensor, a transmitter, a receiver, or a duplexer. In addition, the FBAR may be used for an acoustic resonant mass sensor, a resonant element, an oscillator, and a small lightweight filter of a chemical and biological device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect of the present invention, there is provided a film bulk acoustic resonator (FBAR), including an acoustic resonance unit including a first electrode, a second electrode, and a piezoelectric layer disposed between the first electrode and the second electrode, an air gap disposed below the acoustic resonance unit and above a substrate to reflect the acoustic wave, and an anchor disposed on both sides of the air gap, the anchor having a thickness identical to that of the air gap.

The FBAR may further include a groove disposed on a boundary surface between the air gap and the anchor, and having a thickness smaller than that of the air gap.

The FBAR may further include an etching prevention layer disposed on the substrate to prevent etching of the substrate during formation of the air gap, and a membrane disposed on the air gap, the anchor, and the groove.

A portion of the membrane disposed on the air gap may have the same height from the substrate as a portion of the membrane disposed on the anchor.

The anchor may be formed of a material having a resistivity greater than or equal to 10 kiloohm centimeters (kΩcm).

The anchor and the air gap may be formed by etching a portion of a sacrificial layer laminated on the substrate, the portion corresponding to the air gap based on the groove.

The sacrificial layer may be formed using polysilicon.

The FBAR of may further include an input release hole configured to be an inlet for a gas to etch a sacrificial layer laminated on the etching prevention layer to form the air gap, and an output release hole configured to be an outlet for the gas.

According to another aspect of the present invention, there is also provided an FBAR including a substrate, an etching prevention layer disposed on the substrate, an air gap disposed on the etching prevention layer to reflect an acoustic wave, an anchor disposed on both sides of the air gap on the etching prevention layer, having a width identical to that of the air gap, a groove disposed on a boundary surface between the air gap and the anchor, and having a width smaller than that of the air gap, a membrane disposed on the air gap, the anchor, and the groove, a first electrode disposed on the membrane, a piezoelectric layer disposed on the first electrode, and a second electrode disposed on the piezoelectric layer.

The FBAR may further include a release hole as an inlet and outlet for a material to etch a sacrificial layer laminated on the etching prevention layer.

The release hole may be formed by etching predetermined areas of the membrane, the first electrode, and the piezoelectric layer in a direction from the piezoelectric layer to the membrane.

The release hole may be formed by etching predetermined areas of the membrane, the piezoelectric layer, and the second electrode in a direction from the second electrode to the membrane.

The release hole may be formed by etching predetermined areas of the membrane, the first electrode, the piezoelectric layer, and the second electrode in a direction from the second electrode to the membrane.

The FBAR may further include an input release hole configured to be an inlet for a gas to etch a sacrificial layer laminated on the etching prevention layer to form the air gap, and an output release hole configured to be an outlet for the gas.

When a resistivity of the substrate is less than a predetermined value, the anchor may be formed using a material having a resistivity greater than or equal to the predetermined value.

The substrate may be formed using a material having a resistivity less than or equal to 10 kΩcm.

According to still another aspect of the present invention, there is also provided a method of manufacturing an FBAR, the method including sequentially laminating an etching prevention layer and a sacrificial layer on a substrate, patterning the sacrificial layer to fit a groove corresponding to a boundary between an air gap and an anchor, sequentially laminating a membrane and a first conductive layer on the patterned sacrificial layer, patterning a first electrode on the first conductive layer, sequentially laminating a piezoelectric layer and a second conductive layer on the patterned first electrode, patterning a second electrode on the second conductive layer, forming an input release hole configured to supply a gas to remove the sacrificial layer and an output release hole configured to release the gas by etching an upper portion of the sacrificial layer corresponding to the air gap, and forming the air gap and the anchor by removing the sacrificial layer corresponding to the air gap using the gas based on the groove corresponding to the boundary between the air gap and the anchor.

The patterning of the sacrificial layer may pattern the sacrificial layer so that a distance between the groove and the etching prevention layer is less than a thickness of the sacrificial layer.

The forming of the air gap and the anchor may remove a portion of the sacrificial layer corresponding to the air gap and may not remove a portion of the sacrificial layer corresponding to the anchor based on the groove corresponding to the boundary between the air gap and the anchor using a xenon difluoride ($XeF_2$) gas injected through the input release hole.

The acoustic resonance unit may be configured to generate an acoustic wave based on a signal applied to the first electrode and a signal applied to the second electrode.

The etching prevention layer may be formed of an insulating material comprising at least one of silicon oxide, silicon nitride, or aluminum nitride.

A protection layer may be disposed on the second electrode. According to another aspect, a film bulk acoustic resonator (FBAR) may use an air gap and an anchor formed to have identical heights from a groove patterned on a sacrificial layer, thereby improving deterioration in a crystallization characteristic of a piezoelectric layer caused by an existing inclined structure.

According to another aspect, an FBAR may use an anchor formed using polysilicon having a relatively high resistivity, thereby reducing a loss of an acoustic wave although a substrate with a relatively low resistivity is used.

According to another aspect, an FBAR may use an air gap and an anchor formed by an identical process based on a groove patterned on a sacrificial layer, thereby simplifying a process and reducing costs.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art A film bulk acoustic resonator (FBAR) may be used for input/output of wireless data as a filter, a transmitter, a receiver, or a duplexer that may be used in wireless communication equipment. There are various types and purposes of the wireless communication equipment, and a rapid change from wired equipment to wireless equipment is ongoing. Thus, application for the FBAR is expanding.

The FBAR refers to a device configured to generate an oscillation or a wave of a predetermined frequency using a resonance phenomenon, and may be used as a component of a radio frequency (RF) apparatus, for example, a filter and an oscillator.

A cross-section of the FBAR may include a first electrode, a piezoelectric layer, and a second electrode, and a top view thereof may correspond to an atypical ellipses.

The FBAR may levitate from a substrate through an air gap to increase a reflection characteristic of an acoustic wave. The FBAR having a frequency band pass characteristic may include a plurality of resonators arranged on a plane and connected through a common electrode to increase a reflection characteristic or a transmission characteristic within a range of a frequency band.

A resonant frequency and an antiresonant frequency may be determined based on thicknesses of the electrodes and the piezoelectric layer constituting the FBAR. Thus, when the thicknesses of the electrodes and the piezoelectric layer are fixed, the resonant frequency and the antiresonant frequency may also be fixed.

To maintain a high quality factor, the FBAR may require a structure in which the first electrode, the piezoelectric layer, and the second electrode are isolated from the substrate to prevent an effect of the substrate on an acoustic wave generated on the piezoelectric layer when an electrical potential is applied through the first electrode and the second electrode.

An isolation structure in which a resonant area including the first electrode, the piezoelectric layer, and the second electrode is isolated from the substrate may influence a performance of the FBAR and a commercialization of manufacturing thereof.

In a method of forming an air gap, a photoresist film may be laminated on a substrate. A cavity portion may be formed by etching the photoresist film through patterning. A sacrificial layer may be laminated in the cavity portion. A membrane layer, a first electrode, a piezoelectric layer, and a second electrode may be sequentially laminated on the sacrificial layer and the substrate. An air gap may be formed by etching the sacrificial layer.

In another method of forming an air gap, a sacrificial layer may be laminated on a substrate, and patterned. An insulating film may be laminated on the sacrificial layer and the substrate. A first electrode, a piezoelectric layer, and a second electrode may be sequentially laminated thereon. An air gap may be formed by removing the sacrificial layer.

A via hole connected from an external portion of an element to the sacrificial layer disposed in an internal portion of the element may be formed. The sacrificial layer may be removed by injecting an etching fluid through the via hole, whereby the air gap may be formed in a location of the sacrificial layer.

In general, a sacrificial layer may be provided in an inclined structure when a membrane is formed. In this example, a structure may be unstable due to a relatively great residual stress of the membrane layer. In addition, the first electrode and the second electrode may be supported by the substrate while a thin insulating layer is disposed between the substrate and the first electrode and the second electrode. In this structure, a loss of an acoustic wave from the electrodes to the substrate through the thin insulating layer may occur. Thus, a use of the substrate may be restricted to a high-priced substrate, for example, a high-resistance substrate.

According to an embodiment, by minimizing the inclined structure, the FBAR may have a relatively stable structure for insulation in Radio Frequency (RF) with the substrate.

Figure 1:
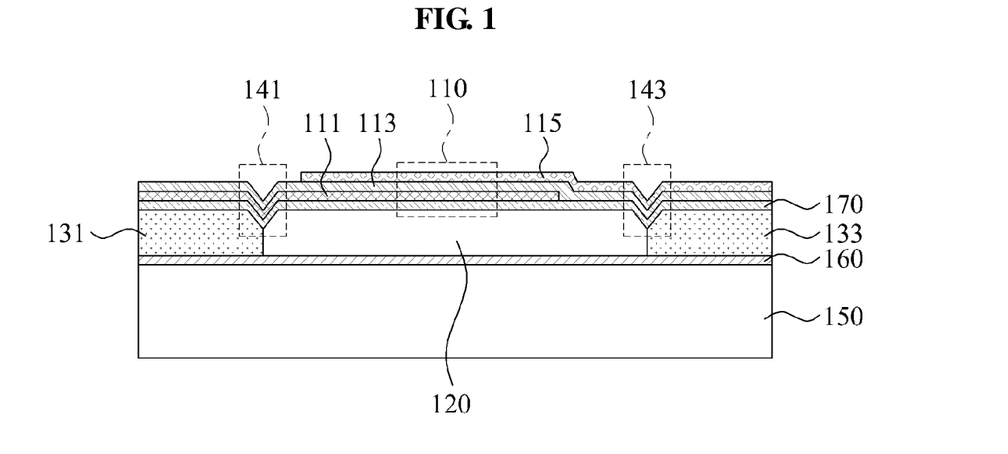
FIG. 1 is a diagram illustrating an example of a film bulk acoustic resonator (FBAR).

FIG. 1 is a cross-sectional view of an FBAR. Referring to FIG. 1, the FBAR includes an acoustic resonance unit 110, a groove 141, a groove 143, an air gap 120, an anchor 131, and an anchor 133.

The acoustic resonance unit 110 includes a first electrode 111, a piezoelectric layer 113, and a second electrode 115. The piezoelectric layer 114 may be disposed between the first electrode 111 and the second electrode 115. The acoustic resonance unit 110 may generate a resonant frequency and an antiresonant frequency by enabling the piezoelectric layer 113 to resonate based on a signal applied to the first electrode 111 and a signal applied to the second electrode 115.

The first electrode 111 and the second electrode 115 may be formed using a metallic material, such as, for example, gold, molybdenum, ruthenium, aluminum, platinum, titanium, tungsten, palladium, chrome, and nickel.

The acoustic resonance unit 110 may use an acoustic wave of a piezoelectric material. When an RF signal is applied to the piezoelectric material, a mechanical oscillation may occur in a direction of a thickness of a piezoelectric film and thus, an acoustic wave may be generated. The piezoelectric material may include material, such as, for example, zinc oxide (ZnO), aluminum nitride (AlN), and quartz.

A resonance phenomenon may occur when a ½ of a wavelength of the applied RF signal corresponds to the thickness of the piezoelectric film. When the resonance phenomenon occurs, an electrical impedance may change sharply. Thus, the FBAR may be used as a filter that may select a frequency. The resonant frequency may be determined based on, for example, the thickness of the piezoelectric film, an electrode surrounding the piezoelectric film, and a unique elastic wave velocity of the piezoelectric film. In an example, as the thickness of the piezoelectric film decreases, the resonant frequency may increase.

The first electrode 111 may be disposed on a membrane 170. The membrane 170 may be disposed on the air gap 120 to maintain a shape of the air gap 120 and support a structure of the acoustic resonance unit 110.

A reflection characteristic of the acoustic wave generated by the acoustic resonance unit 110 may increase through the air gap 120. The air gap 120 may correspond to an empty space having an impedance close to infinity. Thus, the acoustic wave may not be lost through the air gap 120, and remain in the acoustic resonance unit 110.

The air gap 120 may be formed using a sacrificial layer patterned above a substrate 150 to fit a shape of the air gap 120. In this example, the anchor 131 and the anchor 133 may be formed together. The anchor 131, the anchor 133, and the air gap 120 may be formed using the same sacrificial layer. The sacrificial layer may be laminated on an etching prevention layer 160. A portion of the sacrificial layer corresponding to the air gap 120 may be removed through patterning, and a remaining portion of the sacrificial layer may correspond to the anchor 131 and the anchor 133. The sacrificial layer may include polysilicon (poly Si). Poly Si has a relatively high resistivity, in an approximate range of tens of thousands of kiloohm centimeters (kΩcm).

A boundary between the air gap 120 and the anchor 131 may correspond to the groove 141, and a boundary between the air gap 120 and the anchor 133 may correspond to the groove 143. The groove 141 and the groove 143 may be formed by laminating a photoresist on the sacrificial layer, removing a portion of the photoresist corresponding to the groove 141 and the groove 143, and etching the sacrificial layer in shapes of the groove 141 and the groove 143.

When the groove 141 and the groove 143 are formed, the photoresist on the sacrificial layer may be removed, and the membrane 170, the first electrode 111, the piezoelectric layer 113, and the second electrode 115 may be laminated. In this example, except at portions of the groove 141 and the groove 143, the membrane 170, the first electrode 111, the piezoelectric layer 113, and the second electrode 115 may be laminated at identical heights on the air gap 120, the anchor 131, and the anchor 133. Thus, an inclined structure of the FBAR may be minimized.

The groove 141 and the groove 143 may be formed to have gaps smaller than that of the air gap 120. The groove 141 and the groove 143 may be formed by adjusting an etching degree within a range of the thickness of the sacrificial layer.

The air gap 120 may be formed by removing the sacrificial layer using a gas injected through a release hole (not shown). In this example, the groove 141 and the groove 143 may prevent procession of the injected gas into areas of the anchor 131 and the anchor 133. Thus, by removing only a portion of the sacrificial layer corresponding to the air gap 120 using the injected gas, the air gap 120 may be formed. The anchor 131 and the anchor 133 corresponding to an unetched area of the sacrificial layer may support the membrane 170. Thus, the air gap 120, the anchor 131, and the anchor 133 may be formed from the single sacrificial layer.

The etching prevention layer 160 may be used to prevent damage to the substrate 150 during the process of forming the air gap 120. The etching prevention layer 160 may prevent the gas injected through the release hole from damaging the substrate 150. The etching prevention layer 160 may be formed using an insulating material. The insulating material may include a material based on silicon oxide, a material based on silicon nitride, and a material based on aluminum nitride.

The acoustic resonance unit 110 may further include a protection layer (not shown). The protection layer may be disposed on the second electrode 115 to protect an exposure of the second electrode 115 to an external environment. The exposure to the external environment may indicate an exposure to atmospheric moisture, temperature, and other atmospheric constituents. The protection layer may be formed using an insulating material. The protection layer may be used to adjust the resonant frequency.

The substrate 150 may be formed using silicon or poly Si. The membrane 170 and the first electrode 111 may be disposed on or above the anchor 131. Since the anchor 131 is formed using poly Si having a relatively high resistivity, a probability that an acoustic wave flowing in the first electrode 111 may be lost through the substrate 150 may decrease. In this example, the substrate 150 may be formed using a material having a lower resistivity than poly Si. The membrane 170, the piezoelectric layer 113, and the second electrode 115 may be disposed on or above the anchor 133. Since the anchor 133 is formed using the same sacrificial layer used to form the anchor 131, a probability that an acoustic wave flowing in the second electrode 115 may be lost through the substrate 150 may decrease.

Figure 2:
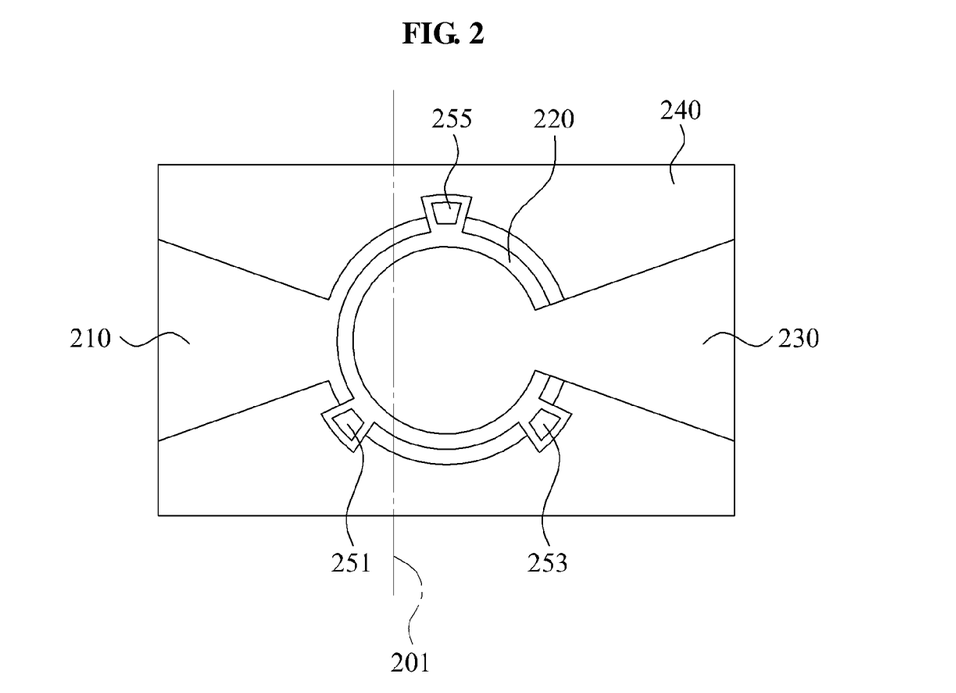
FIG. 2 is a diagram illustrating an example of an FBAR.

FIG. 2 is a diagram illustrating an example of a FBAR. FIG. 2 is a view of the FBAR of FIG. 1 when it is viewed from above. FIG. 1 is a cross-sectional view of the FBAR viewed from a cross-section along line 201. Referring to FIG. 2, when RF signals are applied to a first electrode 210 and a second electrode 230, the FBAR may transfer an acoustic wave generated on a piezoelectric layer 220 to an external device through the first electrode 210 and the second electrode 230.

The first electrode 210 may be disposed on a membrane 240. The membrane 240 may be disposed on an anchor, an air gap, and a groove. The membrane 240 may be laminated to be inclined only on the groove, and laminated horizontally on the anchor and the air gap. By minimizing the inclined structure, the FBAR may be stably structured.

The air gap may be formed by removing a sacrificial layer using a material injected through release holes 251, 253, and 255. The injected material may include, for example, a xenon difluoride ($XeF_2$) gas. The material injected through the release holes 251, 253, and 255 may be used to etch only a portion of the sacrificial layer corresponding to the air gap based on the groove corresponding to a boundary between the air gap and the anchor. In this example, an unetched portion of the sacrificial layer may correspond to the anchor.

Figure 3:
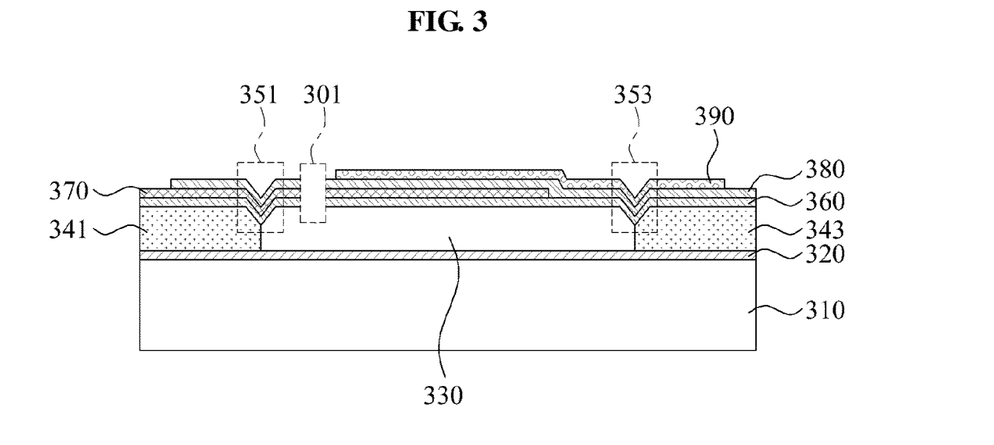
FIG. 3 is a diagram illustrating an example of an FBAR.

FIG. 3 is a diagram illustrating an example of an FBAR. Referring to FIG. 3, the FBAR includes a release hole 301. The FBAR further includes a substrate 310, an etching prevention layer 320, an air gap 330, an anchor 341, an anchor 343, a groove 351, a groove 353, a membrane 360, a first electrode 370, a piezoelectric layer 380, and a second electrode 390.

The etching prevention layer 320 may be disposed on the substrate 310. The etching prevention layer 320 may be used to prevent damage to the substrate 310 during a process of forming the air gap 330. The etching prevention layer 320 may be formed using an insulating material. The insulating material may include one of a material based on silicon oxide, a material based on silicon nitride, and a material based on aluminum nitride.

The air gap 330, the anchor 341, and the anchor 343 may be disposed on the etching prevention layer 320. The air gap 330, the anchor 341, and the anchor 343 may be formed from an identical sacrificial layer. Using the identical sacrificial layer, the anchor 341 and the air gap 330 may be formed based on the groove 351, which corresponds to a boundary between the two. Likewise, the anchor 343 and the air gap 330 may be formed based on the groove 353, which corresponds to a boundary between the two.

The groove 351 and the groove 353 may be formed by being partially etched through patterning of the sacrificial layer.

The anchor 341 and the anchor 343 may be formed using a material having a resistivity greater than or equal to 10 $k\Omega cm$. In this example, the substrate may be formed using a material having a resistivity less than or equal to 10 $k\Omega cm$.

The air gap 330 may be formed by etching a portion of the sacrificial layer disposed on the etching prevention layer 320, the portion corresponding to the air gap 330. In this example, a material to be used to remove the sacrificial layer may be injected through the release hole 301. The injected material may be used to remove the sacrificial layer based on the groove 351 corresponding to the boundary between the anchor 341 and the air gap 330, and the groove 353 corresponding to the boundary between the anchor 343 and the air gap 330. Thus, a space between the groove 351 and the groove 353 may correspond to the air gap 330.

The release hole 301 may be formed by etching predetermined areas of the membrane 360, the first electrode 370, and the piezoelectric layer 380 in a direction from the piezoelectric layer 380 to the membrane 360.

The membrane 360 may be disposed on the air gap 330, the anchor 341, the anchor 343, the groove 351, and the groove 353. The membrane 360 may be laminated on an inclined surface having a gradient on the groove 351 and the groove 353, and laminated to be flat on the remaining portions. A portion of the membrane 360 disposed on the air gap 330, a portion of the membrane 360 disposed on the anchor 341, and a portion of the membrane 360 disposed on the anchor 343 may have identical heights from the etching prevention layer 320. The etching prevention layer 320 may be used to maintain a shape of the air gap 330.

An RF signal may be input into the first electrode 370, and output from the second electrode 390. Conversely, an RF signal may be input into the second electrode 390, and output from the first electrode 370.

An acoustic wave vertically generated on the first electrode 370, the piezoelectric layer 380, and the second electrode 390 may be reflected by the air gap 330 acting as a reflective surface.

The sacrificial layer may be formed using poly Si having a relatively high resistivity. Since the anchor 341 and the anchor 343 may also be formed using poly Si, an acoustic wave and power lost through the substrate 310 may be reduced. In this example, the substrate 310 may be formed using a material having a lower resistivity than the material of the sacrificial layer. In another example, when the resistivity of the substrate is less than a predetermined value, the sacrificial layer may be formed using a material having a resistivity greater than or equal to the predetermined value.

Figure 4:
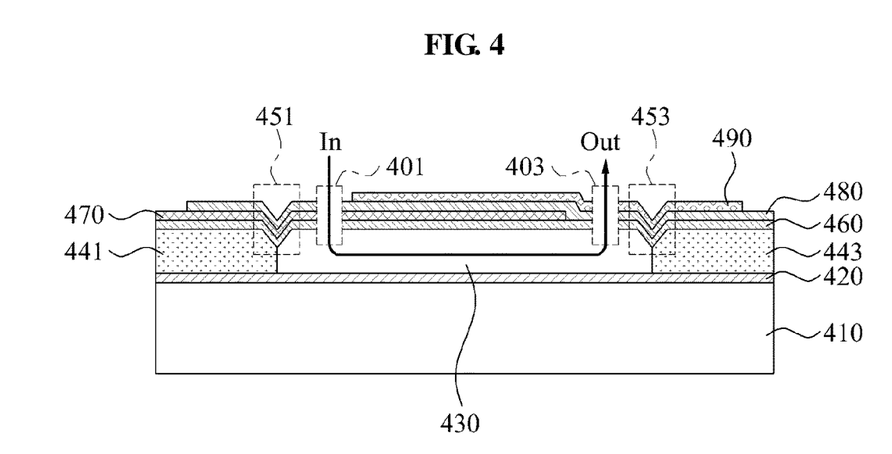
FIG. 4 is a diagram illustrating an example of an FBAR.

FIG. 4 is a diagram illustrating an example of an FBAR. Referring to FIG. 4, the FBAR includes two release holes, release hole 401 and release hole 403. The FBAR further includes a substrate 410, an etching prevention layer 420, an air gap 430, an anchor 441, an anchor 443, a groove 451, a groove 453, a membrane 460, a first electrode 470, a piezoelectric layer 480, and a second electrode 490.

The etching prevention layer 320 may be disposed on the substrate 410. The etching prevention layer 420 may be used to prevent damage to the substrate 410 during a process of forming the air gap 430.

The air gap 430, the anchor 441, and the anchor 443 may be disposed on the etching prevention layer 420. The anchor 441 and the anchor 443 may be disposed on both sides of the air gap 430. The anchor 441 and the anchor 443 may have gaps identical to that of the air gap 430.

The air gap 430, the anchor 441, and the anchor 443 may be formed from an identical sacrificial layer. Using the identical sacrificial layer, the anchor 441 and the air gap 430 may be formed based on the groove 451, which corresponds to a boundary between the two. Likewise, the anchor 443 and the air gap 430 may be formed based on the groove 453, which corresponds to a boundary between the two.

The groove 451 and the groove 453 may be formed by being partially etched through patterning of the sacrificial layer. A photoresist may be laminated on the sacrificial layer, patterning on the photoresist may be performed through a photolithography process, and a patterned portion may be etched through exposure. In this example, only portions corresponding to the groove 451 and the groove 453 may be etched.

The anchor 441 and the anchor 443 may be formed using a material having a resistivity greater than or equal to 10 kΩcm. In this example, the substrate may be formed using a material having a resistivity less than or equal to 10 kΩcm.

The air gap 430 may be formed by etching a portion of the sacrificial layer disposed on the etching prevention layer 420, the portion corresponding to the air gap 430. In this example, a material to be used to remove the sacrificial layer may enter through the release hole 401, and exit through the release hole 403. Conversely, a material to be used to remove the sacrificial layer may be injected through the release hole 403, and exit through the release hole 401. The injected material may include a xenon difluoride (XeF$_2$) gas.

A removal direction of the sacrificial layer may be determined through a flow of In/Out. The injected material may be used to remove the sacrificial layer based on the groove 451 corresponding to the boundary between the anchor 441 and the air gap 430 and the groove 453 corresponding to the boundary between the anchor 443 and the air gap 430. Thus, a space between the groove 451 and the groove 453 may correspond to the air gap 430.

The release hole 401 may be formed by etching predetermined areas of the membrane 460, the first electrode 470, and the piezoelectric layer 480 in a direction from the piezoelectric layer 480 to the membrane 460.

The release hole 403 may be formed by etching predetermined areas of the membrane 460, the piezoelectric layer 480, and the second electrode 490 in a direction from the second electrode 490 to the membrane 460. Although not illustrated in FIG. 4, another release hole may be formed by etching predetermined areas of the membrane 460, the first electrode 470, the piezoelectric layer 480, and the second electrode 490 in a direction from the second electrode 490 to the membrane 460.

The membrane 460 may be disposed on the air gap 430, the anchor 441, the anchor 443, the groove 451, and the groove 453. The membrane 460 may be laminated on an inclined surface having a gradient on the groove 451 and the groove 453, and the membrane 460 may be laminated to be flat on the remaining portions.

An RF signal may be input into the first electrode 470, and output from the second electrode 490. Conversely, an RF signal may be input into the second electrode 490, and output from the first electrode 470. An acoustic wave may be generated on the piezoelectric layer 480 based on the input RF signal.

An acoustic wave vertically generated on the first electrode 470, the piezoelectric layer 480, and the second electrode 490 may be reflected by the air gap 430 acting as a reflective surface.

Figure 5:
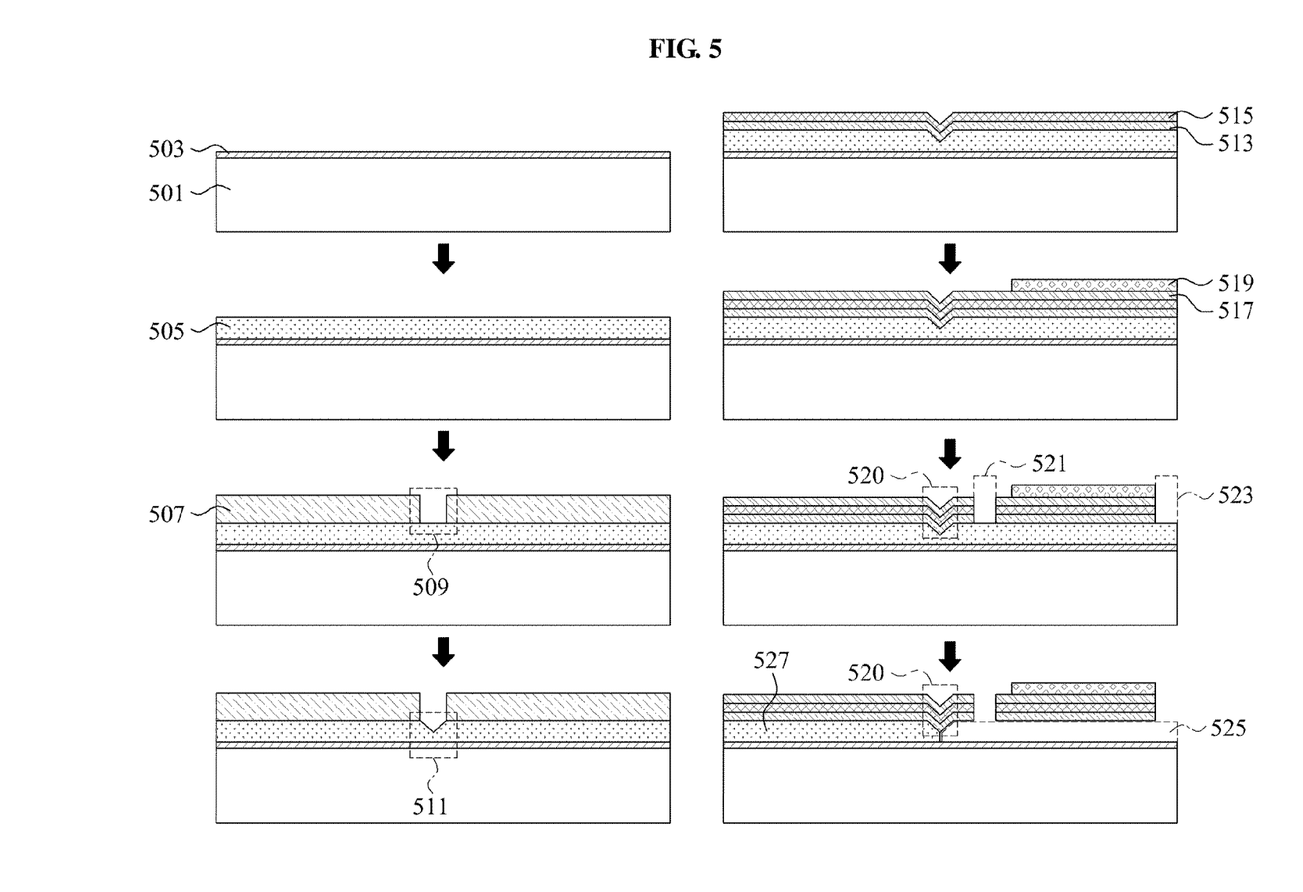
FIG. 5 is a diagram illustrating an example of a method of manufacturing an FBAR.

FIG. 5 is a diagram illustrating an example of a method of manufacturing an FBAR.

The FBAR manufacturing method may sequentially laminate an etching prevention layer 503 and a sacrificial layer 505 on a substrate 501. A material used for the sacrificial layer 505 may include poly Si and a polymer. A material used for the etching prevention layer 503 may include a silicon oxide film, a silicon nitride film, and an aluminum nitride film. The etching prevention layer 503 may be used to prevent damage to the substrate 501 when a portion of the sacrificial layer 505 corresponding to an air gap 525 is removed during a final process.

The FBAR manufacturing method may laminate a photoresist 507 on the sacrificial layer 505, and remove a portion 509 corresponding to a groove 511 by patterning the photoresist through a photolithography process. In other words, the sacrificial layer 505 may be patterned to fit a shape of the groove 511.

The FBAR manufacturing method may form the groove 511 through etching at a portion of the patterned photoresist. In this example, a distance between the groove 511 and the etching prevention layer 503 may be less than a thickness of the sacrificial layer 505.

The FBAR manufacturing method may remove the photoresist disposed on the sacrificial layer after the groove 511 is formed.

The FBAR manufacturing method may sequentially laminate a membrane 513 and a first conductive layer 515 on the patterned sacrificial layer. A material used for the membrane 513 may include a silicon oxide film and a silicon nitride film. A material used for the first conductive layer may include gold, molybdenum, ruthenium, aluminum, platinum, titanium, tungsten, palladium, chrome, and nickel.

The FBAR manufacturing method may pattern a first electrode on the first conductive layer 515. A photoresist may be disposed on the first conductive layer 515. Patterning may be performed through a photolithography process. The first electrode having a desired shape may be formed using the patterned photoresist as a mask.

The FBAR manufacturing method may sequentially laminate a piezoelectric layer 517 and a second conductive layer 519 on the first electrode. The FBAR manufacturing method may pattern a second electrode on the second conductive layer 519. A photoresist may be laminated on the second conductive layer 519. Patterning may be performed through a photolithography process. The second electrode having a desired shape may be formed using the patterned photoresist as a mask.

The FBAR manufacturing method may form an input release hole 521 and an output release hole 523. The input release hole 521 may be formed on an internal side of a groove 520, for example, on a side of an acoustic resonance unit to generate an acoustic wave. A gas to be used to remove the sacrificial layer 505 may enter through the input release hole 521. The gas used to remove the sacrificial layer 505 may exit through the output release hole 523.

The gas injected through the input release hole 521 may be used to remove the sacrificial layer 505 in a direction of the output release hole 523 based on the groove 520 corresponding to a boundary. The gas may include a xenon difluoride (XeF$_2$) gas. The injected gas may be used to remove the sacrificial layer 505, whereby the air gap 525 may be formed. An unremoved portion of the sacrificial layer 505 may correspond to an anchor 527.

The FBAR manufacturing method may form an overall shape of a structure without a great degree of curvature, thereby preventing deterioration in a crystallization characteristic of the piezoelectric layer 517 in an inclined portion. In addition, implementation of the inclined portion may be unnecessary and thus, an excellent implementation feasibility of the process may be achieved.

By simultaneously implementing the anchor 527 and the air gap 525, the process may be simplified and cost-effective. In addition, by forming the anchor using poly Si having a relatively high resistivity, a characteristic of the FBAR may be improved.

By using an anchor having a relatively high resistivity, a substrate loss of a device among RF characteristics may be reduced.

Although a few embodiments of the present invention have been shown and described, the present invention is not limited to the described embodiments. Instead, it would be appreciated by those skilled in the art that changes may be made to these embodiments without departing from the principles and spirit of the invention, the scope of which is defined by the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

The invention claimed is:

1. A film bulk acoustic resonator (FBAR), comprising:
an acoustic resonance unit comprising a first electrode, a second electrode, and a piezoelectric layer disposed between the first electrode and the second electrode;
an air gap disposed below the acoustic resonance unit and above a substrate to reflect the acoustic wave;
respective anchors disposed on both sides of, and not vertically overlapping, the air gap; and
a groove formed by an edge of an anchor of the respective anchors and an edge of the air gap, the groove being configured, with respect to the air gap, to prevent a procession of gas beyond the air gap during formation of the air gap through injection of the gas into an area above the substrate corresponding to the air gap.

2. The FBAR of claim 1, further comprising:
an etching prevention layer disposed on the substrate to prevent etching of the substrate during formation of the air gap; and
a membrane disposed on the air gap and the anchor.

3. The FBAR of claim 2, wherein a portion of the membrane disposed on the air gap has the same height from the substrate as a portion of the membrane disposed on the anchor.

4. The FBAR of claim 1, wherein the anchor is formed of a material having a resistivity greater than or equal to 10 kiloohm centimeters (kΩcm).

5. The FBAR of claim 1, wherein the anchor, the air gap, and the groove are formed through etching of a sacrificial layer laminated on the substrate.

6. The FBAR of claim 5, wherein the sacrificial layer is formed using polysilicon.

7. A film bulk acoustic resonator (FBAR), comprising:
a substrate;
an etching prevention layer disposed on the substrate;
an air gap disposed on the etching prevention layer to reflect an acoustic wave;
respective anchors disposed on both sides of, and not vertically overlapping, the air gap on the etching prevention layer;
a groove formed by an edge of an anchor of the respective anchors and an edge of the air gap, the groove being configured, with respect to the air gap, to prevent a procession of gas beyond the air gap during formation of the air gap through injection of the gas into an area above the substrate corresponding to the air gap;
a membrane disposed on the air gap and the respective anchors;
a first electrode disposed on the membrane;
a piezoelectric layer disposed on the first electrode; and
a second electrode disposed on the piezoelectric layer.

8. The FBAR of claim 7, further comprising:
a release hole as an inlet and outlet for a material to etch a sacrificial layer laminated on the etching prevention layer.

9. The FBAR of claim 8, wherein the release hole is formed by etching predetermined areas of the membrane, the first electrode, and the piezoelectric layer in a direction from the piezoelectric layer to the membrane.

10. The FBAR of claim 8, wherein the release hole is formed by etching predetermined areas of the membrane, the piezoelectric layer, and the second electrode in a direction from the second electrode to the membrane.

11. The FBAR of claim 8, wherein the release hole is formed by etching predetermined areas of the membrane, the first electrode, the piezoelectric layer, and the second electrode in a direction from the second electrode to the membrane.

12. The FBAR of claim 7, wherein, a resistivity of the substrate is less than a resistivity of a material forming the anchor.

13. The FBAR of claim 7, wherein the substrate is formed using a material having a resistivity less than or equal to 10 kiloohm centimeters (kΩcm).

14. The FBAR of claim 1, wherein the acoustic resonance unit is configured to generate an acoustic wave based on a signal applied to the first electrode and a signal applied to the second electrode.

15. The FBAR of claim 7, wherein the etching prevention layer is formed of an insulating material comprising at least one of silicon oxide, silicon nitride, or aluminum nitride.

16. The FBAR of claim 1, wherein the edge of the anchor is inclined so a height of the inclined edge of the anchor is within a range from zero to a height of the air gap.

17. The FBAR of claim 16, wherein the groove has a depth smaller than a height of that of the air gap.

18. The FBAR of claim 16, wherein the air gap and the anchor abut each other.

19. A film bulk acoustic resonator (FBAR), comprising:
an acoustic resonance unit comprising a first electrode, a second electrode, and a piezoelectric layer disposed between the first electrode and the second electrode;
an air gap disposed below the acoustic resonance unit and above a flat substrate to reflect the acoustic wave;
respective anchors disposed on both sides of the air gap; and
a membrane disposed on the air gap and the anchors,
wherein an entire boundary length of the air gap adjacent to the substrate is smaller than an entire remainder boundary length of the air gap.

20. A film bulk acoustic resonator (FBAR), comprising:
an acoustic resonance unit comprising a first electrode, a second electrode, and a piezoelectric layer disposed between the first electrode and the second electrode;
an air gap disposed below the acoustic resonance unit and above a substrate to reflect the acoustic wave;
respective anchors disposed on both sides of, and not vertically overlapping, the air gap; and
a groove being formed between an anchor of respective anchors and the air gap, wherein the respective anchors, the air gap, and the groove are formed from a single sacrificial layer.

21. A film bulk acoustic resonator (FBAR), comprising:
an acoustic resonance unit comprising a first electrode, a second electrode, and a piezoelectric layer disposed between the first electrode and the second electrode;
an air gap disposed below the acoustic resonance unit and above a substrate to reflect the acoustic wave;
respective anchors disposed on both sides of, and not vertically overlapping, the air gap,
wherein an edge of the air gap and an edge of an anchor of the respective anchors are inclined and form a separation between the air gap and the anchor.

22. The FBAR of claim 16, wherein the anchors are disposed in the same vertical layer as the air gap.

* * * * *